United States Patent [19]
Hashimoto

[11] Patent Number: 5,933,716
[45] Date of Patent: Aug. 3, 1999

[54] METHOD OF MAKING SEMICONDUCTOR DEVICE USING OBLIQUE ION IMPLANTATION

[75] Inventor: Shingo Hashimoto, Tokyo, Japan

[73] Assignee: NEC Corporation, Tokyo, Japan

[21] Appl. No.: 08/997,644

[22] Filed: Dec. 23, 1997

[30] Foreign Application Priority Data

Dec. 26, 1996 [JP] Japan ..................................... 8-348042

[51] Int. Cl.$^6$ .................................................. H01L 21/336
[52] U.S. Cl. .......................................... 438/197; 257/360
[58] Field of Search ..................... 438/197, 211; 257/360

[56] References Cited

U.S. PATENT DOCUMENTS 5,869,872  11/1997  Asai et al. ............................... 257/360

FOREIGN PATENT DOCUMENTS 7221041  8/1995  Japan ........................... G11B 23/087

*Primary Examiner*—Charles Bowers
*Assistant Examiner*—Craig Thompson
*Attorney, Agent, or Firm*—Hayes Soloway Hennessey Grossman & Hage, PC

[57] ABSTRACT

The process of making a semiconductor device in which an n-channel MOSFET and a p-channel MOSFET are formed on the same semiconductor substrate is shortened. An impurity of p-type is ion-implanted vertically of a major surface of the semiconductor substrate to form p-type impurity doped layers in the embedding layers and p-type highly-concentrated impurity doped layers in the diffusion layers. Next, an impurity of n-type impurity is ion-implanted from obliquely above the semiconductor substrate major surface to form n-type highly-concentrated impurity doped layers in uppermost surfaces of the embedding layers. In the oblique ion-implantation, the n-type impurity is ion-implanted obliquely of the semiconductor substrate at a predetermined angle or more measured from a normal of the major surface of the semiconductor substrate so that semiconductor substrate portions (diffusion layers) at bottom ends of the contact holes for the p-channel MOSFET may not be viewed from obliquely above the semiconductor substrate major surface.

5 Claims, 4 Drawing Sheets

METHOD OF MAKING SEMICONDUCTOR DEVICE USING OBLIQUE ION IMPLANTATION

BACKGROUND OF THE INVENTION

The present invention relates to a method of making a semiconductor device in which an impurity is doped for improvement of contact to electrode.

When electrode wiring lines are connected to source and drain regions in a MOSFET, contact resistance at an interface between an electrode and a source and at an interface between an electrode and a drain must be decreased. To this end, an impurity is newly doped into source and drain surfaces to make them highly-concentrated impurity regions.

An impurity doping process employed in the production of an SRAM using a CMOS structure will be described hereunder.

Firstly, an n-channel MOSFET and a p-channel MOSFET are formed through an ordinary process. More particularly, as shown in FIG. 2A, a p-type well 32 is first formed in a predetermined region of a n-type semiconductor substrate 31 and a gate electrode 34 constituting the n-channel MOSFET is formed on the p-type well 32 through a gate oxide film 33. At another predetermined region of the semiconductor substrate 31, a gate electrode 35 constituting the p-channel MOSFET is formed through the gate oxide film 33. An n-channel MOSFET region and a p-channel MOSFET region are sectioned by a field oxide film 36.

Subsequently, n-type diffusion layers 37 serving as source and drain of the n-channel MOSFET and p-type diffusion layers 38 serving as source and drain of the p-channel MOSFET are formed. Further, in another region of the p-type well 32, an n-type diffusion layer 37a for body contact is formed.

Thereafter, as shown in FIG. 2B, an inter-layer insulating film 39 is formed on the semiconductor substrate 31, covering the gate electrodes 34 and 35 and the field oxide film 36. Subsequently, as shown in FIG. 2C, a contact hole 37b is formed in the inter-layer insulating film 39 to overlie the diffusion layer 37a. Then, as shown in FIG. 2D, a plug 40a made of polycrystal silicon doped with an impurity is embedded in the contact hole 37b and a GND wiring line 40b is connected to the plug 40a.

Next, as shown in FIG. 2E, a flat inter-layer insulating film 41 is formed on the inter-layer insulating film 39, covering the GND wiring line 40b.

Further, as shown in FIG. 2F, contact holes 42 and contact holes 43 are formed to expose the diffusion layers 37 serving as the source and drain of the n-channel channel MOSFET and the diffusion layers 38 serving as the source and drain of the p-channel MOSFET. Then, as shown in FIG. 2G, a p-type impurity is ion-implanted to the diffusion layers 37 and 38 to form p-type impurity doped layers 44 and p-type highly-concentrated impurity doped layers 45. Subsequently, as shown in FIG. 2H, an n-type impurity is ion-implanted to the diffusion layers 37 constituting the source and drain of the n-channel MOSFET to form n-type highly-concentrated impurity doped layers 44a while the p-channel MOSFET forming region which includes the contact holes 43 being covered with a resist pattern 46.

In formation of the source and drain wiring lines to be connected to the source and drain, the highly-concentrated impurity doped layers 44a and 45 are effective to decrease contact resistance between the electrode wiring line and each of the diffusion layers 37 and contact resistance between the electrode wiring line and each of the diffusion layers 38.

As described above, by forming the GND wiring line and the source and drain wiring line from different layers, that is, by providing a multi-layer wiring structure, the electrode wiring line can be drawn around with a margin and the integration degree can more be improved.

In the aforementioned conventional method, however, the impurities of the different conductivity types are doped in the predetermined regions in course of the impurity doping for decreasing the contact resistance between each of the source and drain layers and the electrode wiring layer and consequently, the number of production process steps is disadvantageously increased.

More particularly, while the n-type impurity is doped, the region where the p-type impurity has been doped must be masked with the resist pattern and accordingly, a process step which includes lithography is needed for formation of the resist pattern.

Therefore, when impurities of different conductivity types are doped in predetermined regions, respectively, the production process is inevitably prolonged.

SUMMARY OF THE INVENTION

The present invention contemplates elimination of the above conventional problems and it is an object of the present invention to shorten the production process of a semiconductor device in which an n-channel MOSFET and a p-channel MOSFET are formed on the same substrate.

To accomplish the above object, a method of making a semiconductor device according to the present invention comprises the steps of forming an insulating film on a major surface of a semiconductor substrate, forming first contact holes and second contact holes in the insulating film at first and second predetermined regions while forming semiconductor layers in the first contact holes such that the semiconductor layers contact semiconductor substrate portions exposing to bottom ends of the first contact holes, and ion-implanting an impurity obliquely of the semiconductor substrate by using the insulating film as a mask at a predetermined angle or more measured from a normal of the major surface of the semiconductor substrate so that semiconductor substrate surface portions at bottom ends of the second contact holes may not be viewed from obliquely above the semiconductor substrate major surface.

In the ion-implantation of the impurity carried out obliquely of the semiconductor substrate described as above, the ion-implanted impurity cannot reach the semiconductor substrate surface portion exposing to the bottom ends of the second contact holes.

DESCRIPTION OF THE PREFERRED EMBODIMENTS

The present invention will now be described by way of example with reference to the accompanying drawings.

Referring to FIGS. 1 and 2, a method of making a semiconductor device according to the present invention will be described.

Figure 1A:
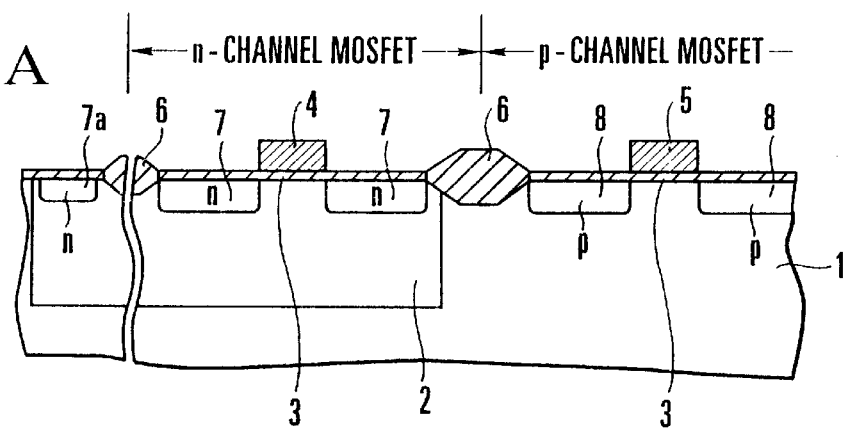
FIGS. 1A–1H illustrates steps of a semiconductor making method according to an embodiment of the present invention.

Firstly, as shown in FIG. 1A, a p-type well 2 is formed in a major surface of an n-type semiconductor substrate 1 at a predetermined region and a gate electrode 4 constituting an n-channel MOSFET is formed on the p-type well 2 through a gate oxide film 3. A gate electrode 5 constituting a p-channel MOSFET is formed on the semiconductor substrate 1 at a different region through the gate oxide film 3. The region of n-channel MOSFET and the region of p-channel MOSFET are sectioned by a field oxide film 6.

Subsequently, n-type diffusion layers 7 serving as source and drain of the n-channel MOSFET and p-type diffusion layers 8 serving as source and drain of the p-type MOSFET are formed. An n-type diffusion layer 7a for body contact is formed in the p-type well 2 at a different region.

Figure 1B:
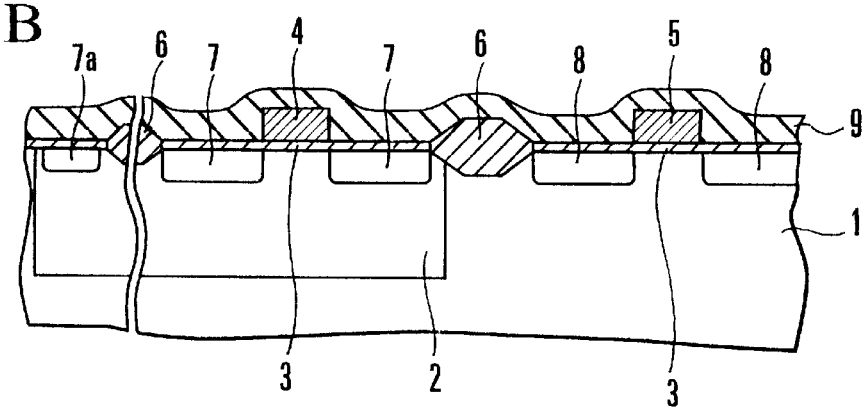
Figure 1C:
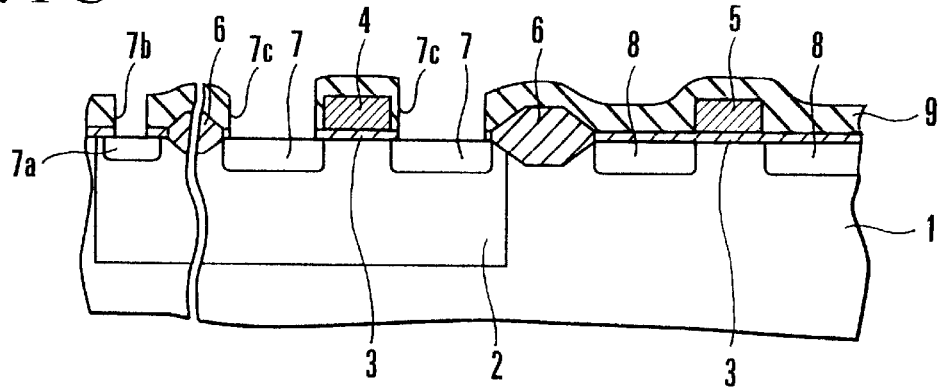

Next, as shown in FIG. 1B, an inter-layer insulating film 9 is formed on the semiconductor substrate 1, covering the gate electrodes 4 and 5 and the field oxide films 6. Subsequently, as shown in FIG. 1C, a contact hole 7b is formed in the inter-layer insulating film 9 to overlie the diffusion layer 7a. Concurrently, in the present embodiment, contact holes 7c are also formed to overlie the diffusion layers 7.

Figure 1D:
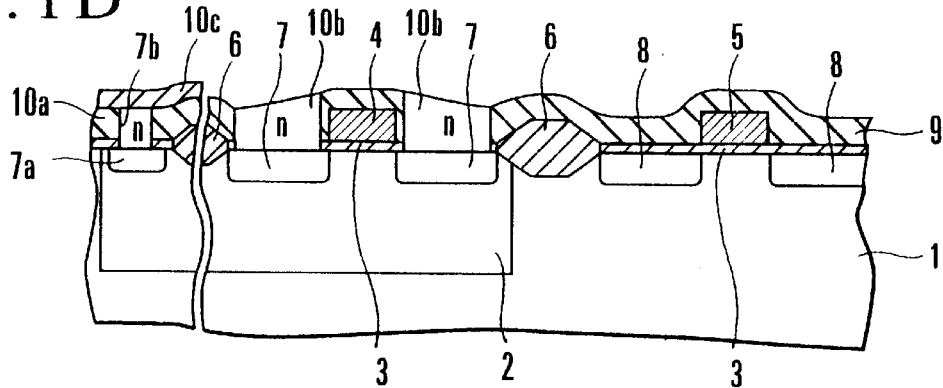

Then, as shown in FIG. 1D, a plug 10a made of polycrystal silicon doped with an n-type impurity is embedded in the contact hole 7b and embedding layers 10b made of the polycrystal silicon are formed in the contact holes 7c. In addition, a GND wiring line 10c is formed connecting to the plug 10a.

Figure 1E:
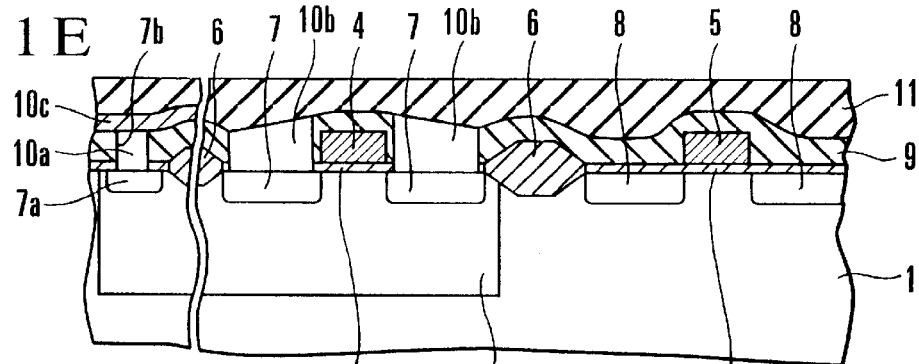

Thereafter, as shown in FIG. 1E, a flat inter-layer insulating film 11 is formed on the inter-layer insulating film 9, covering the GND wiring line 10c. The flat inter-layer insulating film 11 may be flattened by an ordinarily used flattening technique, for example, chemical/mechanical polishing (CMP).

Figure 1F:
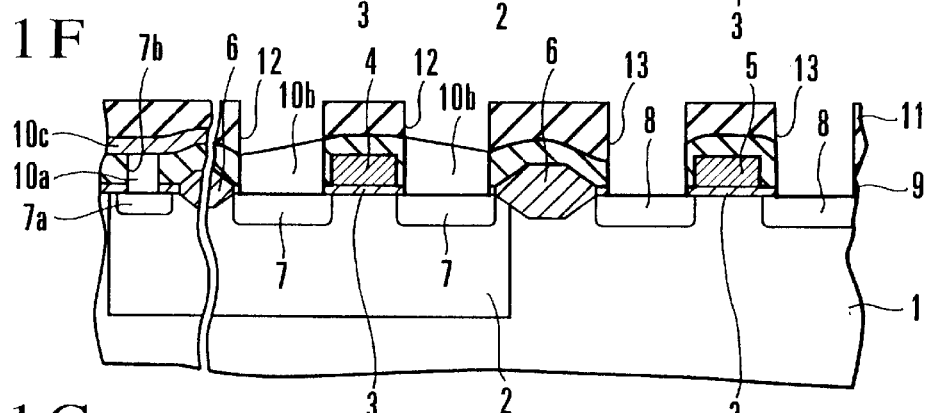
Figure 1G:
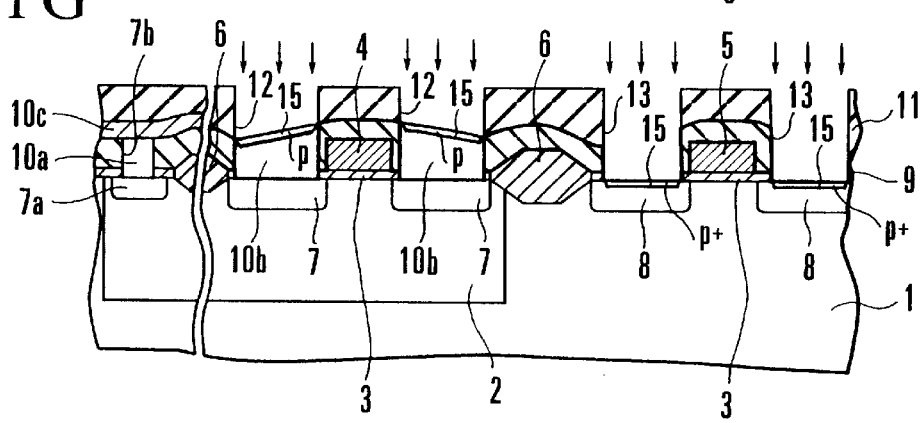

Subsequently, as shown in FIG. 1F, contact holes 12 and contact holes 13 are formed which pass through the two inter-layer insulating films 9 and 11 so as to expose the embedding layers 10b and the diffusion layers 8 serving as the source and drain of the p-channel MOSFET and then, as shown in FIG. 1G, a p-type impurity is ion-implanted vertically of the major surface of the semiconductor substrate to form p-type impurity doped layers 14 and p-type highly-concentrated impurity doped layers 15.

Figure 1H:
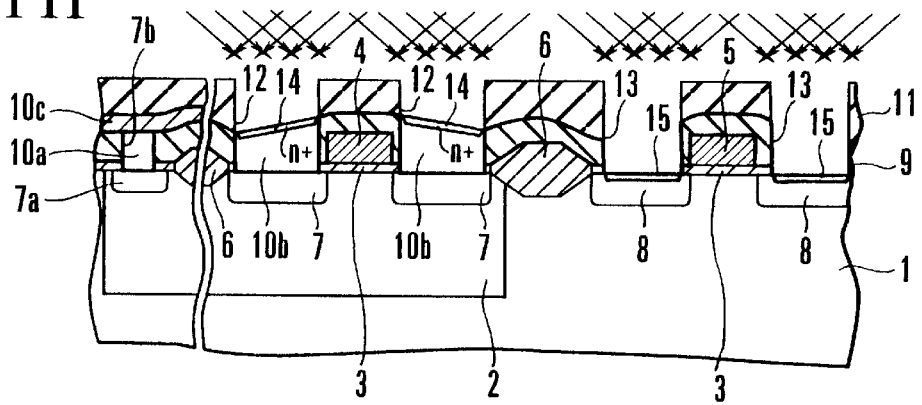
Figure 2A:
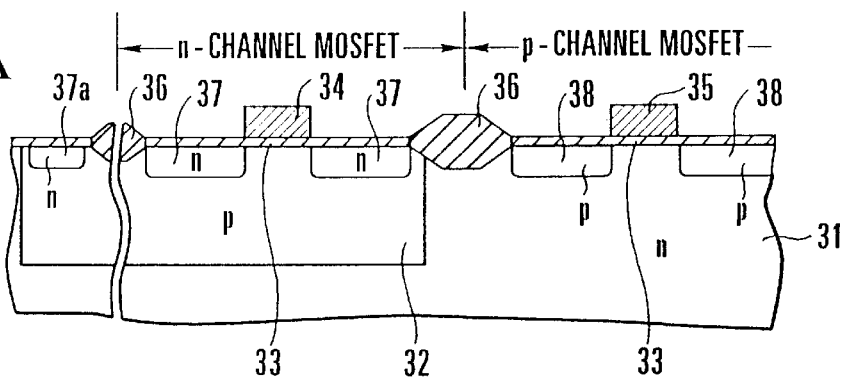
FIGS. 2A–2H illustrates steps of a conventional semiconductor making method.
Figure 2B:
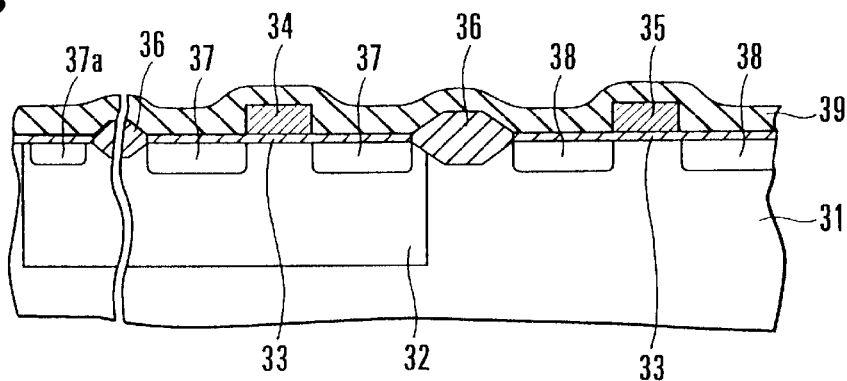
Figure 2C:
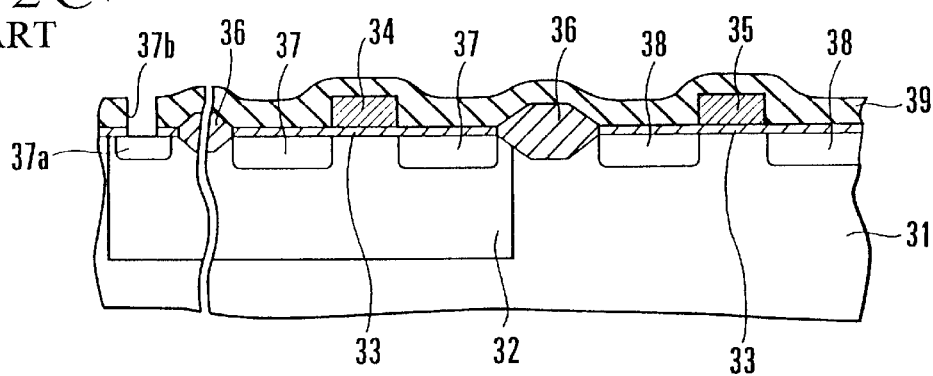
Figure 2D:
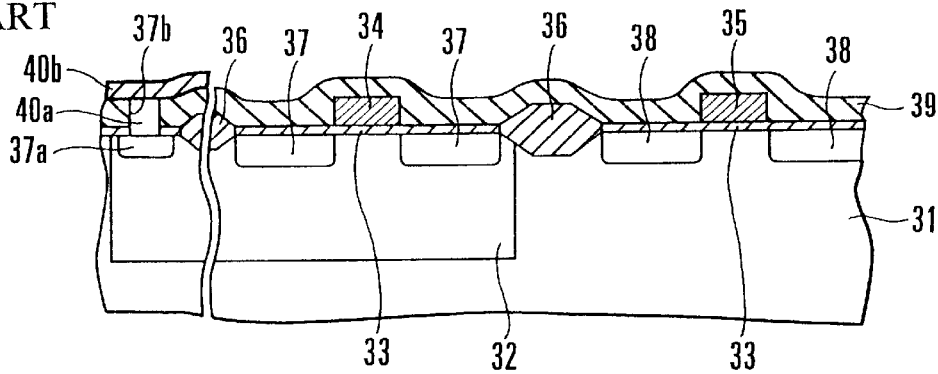
Figure 2E:
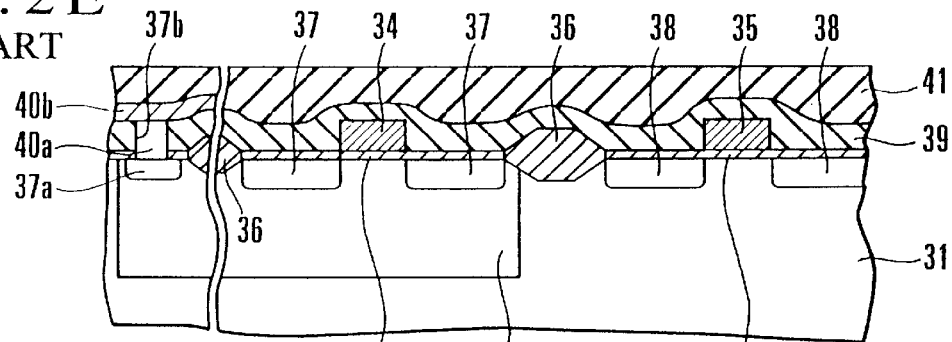
Figure 2F:
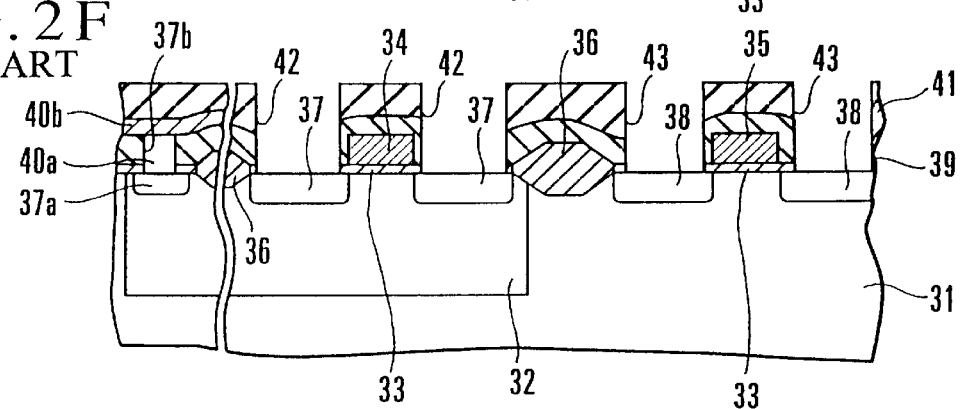
Figure 2G:
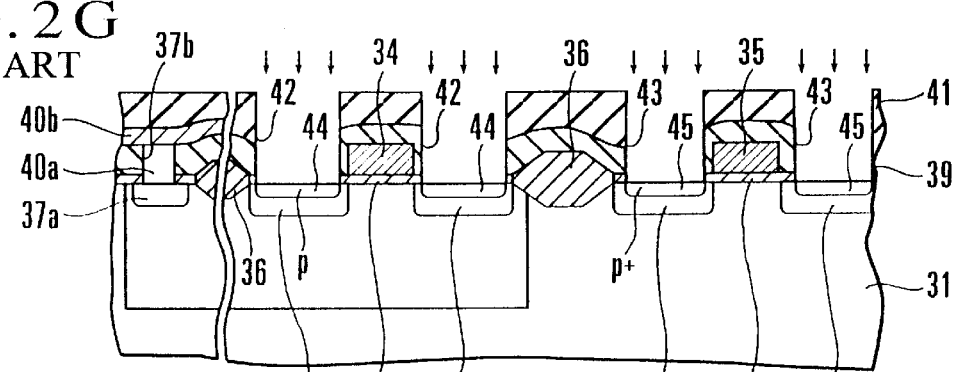
Figure 2H:
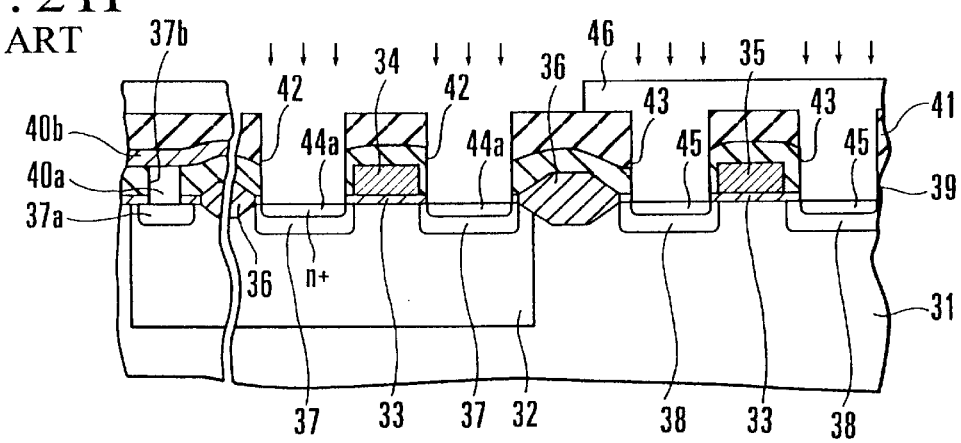

Next, as shown in FIG. 1H, an n-type impurity is ion-implanted from obliquely above the major surface of the semiconductor substrate to form n-type highly-concentrated impurity doped layers 14a. The ion-implantation is carried out using the inter-layer insulating film 11 as a mask at a predetermined angle or more measured from a normal of the major surface of the semiconductor substrate so that semiconductor substrate portions (diffusion layers 8) at the at the bottom ends of the contact holes 13 may not be viewed from obliquely above the semiconductor substrate major surface.

Thus, in the ion-implantation, n-type impurity ions come obliquely of the semiconductor substrate major surface and consequently, they cannot reach the bottom ends of the contact holes 13 at a deeper depth. But, the n-type impurity ions can reach the bottom ends of the contact holes 12 at a shallower depth, that is, can arrive at the embedding layers 10b to form the n-type highly-concentrated impurity doped layers 14a therein.

The oblique ion-implantation is not carried out in only one direction but may preferably be conducted in all circumferential directions which make a predetermined angle to the normal of the major surface of the semiconductor substrate 1 by, for example, rotating the semiconductor substrate undergoing the ion-implantation process.

Further, it is to be noted that the "oblique ion implantation" is carried out with the aim of inverting the p-type impurity layer 15, formed by implanting ions to the overall surface in advance, to the n-type impurity layer 14a by ion-implanting an n-type impurity in a direction which is oblique to the semiconductor substrate 1.

More particularly, of concrete implantation conditions, the implantation angle is determined by the diameter and depth of a formed contact, that is, an aspect ratio of the contact. To try to intentionally express the implantation angle, when θ1 and θ2 which satisfy tan θ1=A/B and tan θ2=C/D, respectively, are defined where A represents a diameter of a contact on the diffusion layer, B represents a depth of the contact, C represents a diameter of an embedded contact and C represents a depth of the embedded contact, the implantation angle θ is expressed by θ1<θ<θ2. The necessary condition for the oblique ion implantation in the present invention is such that ions are not implanted to the contact on the diffusion layer but are implanted to the embedded contact. Energy during the ion implantation, on the other hand, is required to be changed in accordance with the implantation angle if the impurity is desired to be implanted to a constant depth. Further, the quantity of an impurity to be ion-implanted changes as the implantation angle changes. In conclusion, the ion implantation is carried out under the implantation condition which satisfies the inversion of the p-type impurity layer 15 to the n-type impurity layer 14a.

By forming source and drain wiring lines on the thus formed highly-concentrated impurity doped layers 14a, the contact resistance can be reduced as in the conventional semiconductor device.

Since the embedding layers 10b made of polycrystal silicon doped with the n-type impurity and the p-type impurity layer 14 are first formed on the diffusion layers 7 serving as the source and drain constituting the n-channel MOSFET and the uppermost n-type highly-concentrated impurity doped layers 14a are then formed in the embedding layers 10b, the source and drain wiring lines are connected to the source and drain through the n-type highly-concentrated impurity doped layers 14a, thereby reducing the contact resistance.

According to the present embodiment, even when the highly-concentrated impurity doped layers 14a and 15 formed for the sake of reducing the contact resistance have different conductivity types, the selective ion-implantation using the resist pattern based on photolithography is not required.

Accordingly, the present embodiment can dispense with the photoresist pattern forming process which is required conventionally.

As described above, according to the present invention, an insulating film is formed on a major surface of a semiconductor substrate, first contact holes and second contact holes are formed in the insulating layer at first and second predetermined regions while semiconductor layers being formed in the first contact holes such that the semiconductor layers contact semiconductor substrate portions exposing to bottom ends of the first contact holes, and an impurity is ion-implanted obliquely of the semiconductor substrate by using the insulating film as a mask at a predetermined angle or more measured from a normal of the major surface of the semiconductor substrate so that semiconductor substrate surface portions at bottom ends of the second contact holes may not be viewed from obliquely above the semiconductor substrate major surface.

By virtue of the ion-implantation oblique carried out obliquely of the semiconductor substrate, implanted impurity ions can be prevented from reaching semiconductor substrate portions exposing to the bottom ends of the second contact holes.

In this manner, according to the present invention, in contrast to the conventional method in which the resist pattern based on lithography is formed as a mask and ion-implantation is carried out selectively by using the mask, the selective ion-implantation can be effected without resort to the resist pattern.

Consequently, according to the present invention, the process of making a semiconductor device in which, for example, an n-channel MOSFET and a p-channel MOSFET are formed on the same semiconductor substrate can advantageously be shortened.

What is claimed is:

1. A method of making a semiconductor device comprising the steps of:

forming an insulating film on a major surface of a semiconductor substrate;

forming first contact holes and second contact holes in said insulating film at first and second predetermined regions while forming semiconductor layers in said first contact holes such that said semiconductor layers contact semiconductor substrate portions exposing to bottom ends of said first contact holes; and ion-implanting an impurity obliquely of said semiconductor substrate by using said insulating film as a mask at a predetermined angle or more measured from a normal of the major surface of said semiconductor substrate so that semiconductor substrate surface portions at bottom ends of said second contact holes may not be viewed from obliquely above the semiconductor substrate major surface.

2. A semiconductor device making method according to claim 1, wherein said semiconductor layers are doped in advance with an impurity.

3. A method of making a semiconductor device comprising the steps of:

forming a first insulating film on a major surface of a semiconductor substrate;

forming first contact holes in said first insulating film above a first region of said semiconductor substrate;

filling semiconductor layers in said first contact holes;

forming a second insulating film on said first insulating film, covering said semiconductor layers;

forming second contact holes in said second insulating film at the region where said first contact holes are formed and at the same time, forming third contact holes in said first and second insulating films above a second region of said semiconductor substrate;

ion-implanting an impurity of second-conductivity type vertically of said semiconductor substrate by using said second insulating film as a mask; and ion-implanting an impurity of first-conductivity type obliquely of said semiconductor substrate by using said second insulating film as a mask at a predetermined angle or more measured from a normal of the major surface of said semiconductor substrate so that semiconductor substrate surface portions at bottom ends of said third contact holes may not be viewed from obliquely above the semiconductor substrate major surface.

4. A semiconductor device making method according to claim 3, wherein said semiconductor layers are doped in advance with the first conductivity-type impurity.

5. A method of making a semiconductor device comprising the steps of:

forming a well of second conductivity type in a semiconductor substrate of first conductivity type;

forming a first gate electrode constituting a first field effect transistor at a predetermined position on a region of said well through a gate insulating film and forming a second gate electrode constituting a second field effect transistor at a predetermined position on a region of said semiconductor substrate other than said well region through the gate insulating film;

forming first source and drain in the form of impurity regions of first conductivity type which constitute said first field effect transistor in said well region on both sides of said first gate electrode and forming a body contact in the form of an impurity region in a region other than said well region;

forming second source and drain in the form of impurity regions of second conductivity type which constitute said second field effect transistor in said semiconductor substrate on both sides of said second gate electrode;

forming a first inter-layer insulating film on said semiconductor substrate, covering said body contact and said first and second gate electrodes;

forming first contact hole in said first inter-layer insulating film above said body contact and second contact holes in said first inter-layer insulating film above said first source and drain;

filling a first semiconductor layer doped with the impurity of first conductivity type in said first contact hole and second semiconductor layers doped with the impurity of first conductivity type in said second contact holes;

forming an electrode wiring line contacting said first semiconductor layer;

forming a second inter-layer insulating film on said first inter-layer insulating film, covering said electrode wiring line and said second semiconductor layers;

forming third contact holes in said second inter-layer insulating film above said second semiconductor layers and fourth contact holes in said first and second inter-layer insulating films above said second source and drain;

ion-implanting an impurity of second conductivity type vertically of said semiconductor substrate by using said second inter-layer insulating film as a mask; and ion-implanting an impurity of first conductivity type obliquely of said semiconductor substrate by using said second inter-layer insulating film as a mask at a predetermined angle or more measured from a normal of the major surface of said semiconductor substrate so that said second source and drain at bottom ends of said fourth contact holes may not be viewed from obliquely above the semiconductor substrate major surface.

* * * * *